US005291149A

United States Patent [19]
Nunoshima

[11] Patent Number: 5,291,149
[45] Date of Patent: Mar. 1, 1994

[54] OPERATIONAL AMPLIFIER

[75] Inventor: Takeshi Nunoshima, Kyoto, Japan

[73] Assignee: Murata Manufacturing Co., Ltd., Japan

[21] Appl. No.: 859,929

[22] Filed: Mar. 30, 1992

[51] Int. Cl.$^5$ .............................................. H03F 3/45
[52] U.S. Cl. ................................. 330/255; 330/253; 330/257
[58] Field of Search ..................... 330/253, 255, 257

[56] References Cited

U.S. PATENT DOCUMENTS

| 4,360,785 | 11/1982 | Schade, Jr. | 330/253 X |
| 4,377,789 | 3/1983 | Hoover | 330/257 X |
| 4,636,743 | 1/1987 | Cotreau | 330/255 X |

FOREIGN PATENT DOCUMENTS

| 220508 | 12/1983 | Japan | 330/257 |
| 4305 | 1/1984 | Japan | 330/257 |

Primary Examiner—James B. Mullins
Attorney, Agent, or Firm—Ostrolenk, Faber, Gerb & Soften

[57] ABSTRACT

An operational amplifier includes differential amplification circuitry and current mirror circuitry. The differential amplification circuitry includes first and second differential amplification circuits disposed symmetrically in the upper and lower parts of a circuit diagram, and the current mirror circuitry includes first and second current mirror circuits disposed symmetrically in the upper and lower parts of the circuit diagram. The input ends of the first and second differential amplification circuits are connected to a non-inverting input terminal and a inverting input terminal, respectively. Output ends of the first and second differential amplification circuits on the sides of the respective non-inverting inputs are independently connected to the input ends of the first and second current mirror circuits Output ends of the first and second differential amplification circuits on the sides of the respective inverting inputs are independently connected to a positive power supply and a negative power supply, respectively. Output ends of the first and second current mirror circuits are connected together to a load impedance.

10 Claims, 5 Drawing Sheets

OPERATIONAL AMPLIFIER

BACKGROUND OF THE INVENTION

1. Field of the Invention

The present invention relates to operational amplifiers. More specifically, the invention relates to an operational amplifier in which one stage of voltage amplification circuitry is provided.

2. Description of the Related Art

An operational amplifier formed of a connection of a plurality of stages (for example, two stages) of phase inversion type voltage amplification circuits is conventionally known. The operational amplifier formed of such a connected plurality of stages of voltage amplification circuits however suffers from turning points (poles) in the frequency characteristic corresponding to the number of the stages, and a large phase delay as a whole results due to a phase delay in each stage, thereby deteriorating the frequency characteristic. In order to avoid such disadvantages, devices having one stage of voltage amplification circuits and allowing voltage amplification without phase inversion have been proposed.

Figure 1:
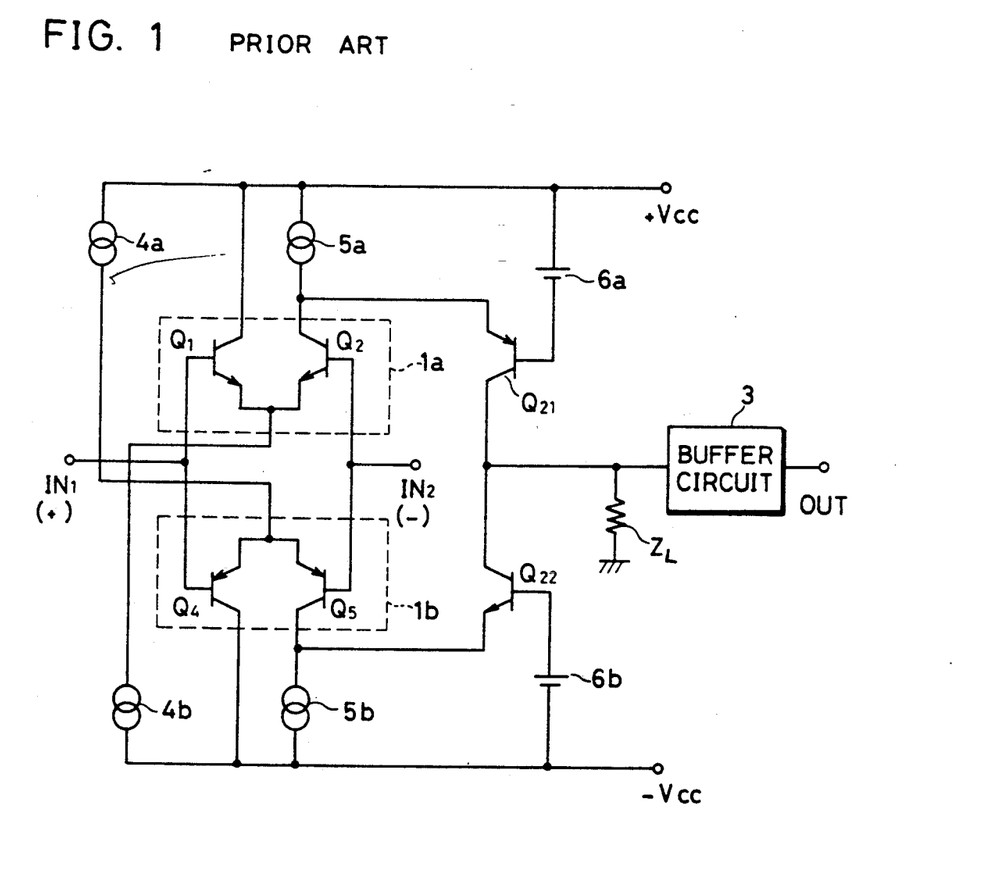
FIG. 1 is an electric circuit diagram showing a conventional operational amplifier having one stage of voltage amplification.

FIG. 1 is an electric circuit diagram showing such an operational amplifier having one stage of voltage amplification circuits. Referring to FIG. 1, the operational amplifier includes in the upper and lower parts of the circuit diagram, a differential amplification circuit 1a formed of a differential connection of NPN transistors $Q_1$ and $Q_2$, and a differential amplification circuit 1b formed of a differential connection of PNP transistors $Q_4$ and $Q_5$, respectively. A power supply voltage Vcc is supplied to the collector of transistor $Q_1$, the collector of transistor $Q_2$ is connected to a constant current circuit 5a, and the power supply voltage Vcc is supplied to constant current circuit 5a. The emitters of transistors $Q_1$ and $Q_2$ are both connected to constant current circuit 4b, and constant current circuit 4b is supplied with a power supply voltage $-$Vcc. The power supply voltage $-$Vcc is supplied to the collector of PNP transistor $Q_4$, the collector of PNP transistor $Q_5$ is connected to constant current circuit 5b, and constant current circuit 5b is supplied with the power supply voltage $-$Vcc. The emitters of transistors $Q_4$ and $Q_5$ are both connected to a constant current circuit 4a, and constant current circuit 4a is supplied with the power supply voltage Vcc. The bases of transistors $Q_1$ and $Q_4$ are connected to an input terminal $IN_1$, and the bases of transistors $Q_2$ and $Q_5$ are connected to an input terminal $IN_2$.

The collector of transistor $Q_2$ is connected to the emitter of transistor $Q_{21}$ with its base grounded, and the collector of transistor $Q_5$ is connected to the emitter of a transistor $Q_{22}$ which has also its base grounded. A power supply 6a is connected to the base of transistor $Q_{21}$, and a power supply 6b is connected to the base of transistor $Q_{22}$. A buffer circuit 3 for current amplification is connected to the connection point of the collectors of transistors $Q_{21}$ and $Q_{22}$. $Z_L$ is a load impedance for transistors $Q_{21}$ and $Q_{22}$ having their bases grounded and is actually an impedance inside the buffer circuit 3 in an actual circuit.

In the operational amplifier shown in FIG. 1, the current changes of differential amplification circuits 1a and 1b due to signals applied to input terminals $IN_1$ and $IN_2$ are extracted from the collectors of base-grounded transistors $Q_{21}$ and $Q_{22}$, the difference between the currents flowing through these transistors $Q_{21}$ and $Q_{22}$ is converted into a voltage value by the load impedance $Z_L$, and the voltage value is output from an output terminal OUT.

The operational amplifier shown in FIG. 1 has advantages over the one formed of a plurality of stages of voltage amplification circuits in that it has a relatively simple circuit configuration, a higher gain band width product ft, and an excellent high frequency characteristic due to its reduced phase delay.

However, in the conventional operational amplifier shown in FIG. 1, the transistor $Q_2$ of differential amplification circuit 1a and transistor $Q_5$ of differential amplification circuit 1b, and base-grounded transistors $Q_{21}$ and $Q_{22}$ are connected together as loads to constant current circuits 5a and 5b in the upper and lower parts, respectively. The current of constant current circuit 5a flow through transistors $Q_2$ and $Q_{21}$. The current of constant current circuit 5b flow through transistors $Q_5$ and $Q_{22}$. The characteristic changes of constant current circuits 5a and 5b adversely affect the operations of transistors $Q_{21}$ and $Q_{22}$ having their bases grounded. More specifically, if the characteristics of the constant current circuits 5a and 5b in the upper and lower parts are not uniform at the time of manufacture, the balance of the current to be shunted, and thereby to flow through transistors $Q_{21}$ and $Q_{22}$, changes between the upper and lower parts, thus producing a difference between the operation currents of transistors $Q_{21}$ and $Q_{22}$. As a result, an unnecessary D.C. component is output as an offset voltage to output terminal OUT at the final stage.

Furthermore, if the power supply voltage Vcc changes, or the temperature changes, the currents of constant current circuits 5a and 5b change, thus changing the operation currents of base-grounded transistors $Q_{21}$ and $Q_{22}$, and, therefore, the frequency characteristics of transistors $Q_{21}$ and $Q_{22}$ also change.

SUMMARY OF THE INVENTION

It is therefore a main object of the present invention to provide an operational amplifier which is less susceptible to the effects of unevenness in devices, changes of power supply voltages, temperature change, etc. and provides a stable output characteristic.

More simply stated, the operational amplifier according to this invention includes a differential amplification circuit, a current mirror circuit, and an impedance element. The differential amplification circuit includes a first differential amplification circuit having its non-inverting input end connected to a non-inverting input terminal, and its inverting input end connected to an inverting input terminal, and a second differential amplification circuit having its inverting input end connected to an inverting input terminal. The current mirror circuit includes a first current mirror circuit having its input end connected to the output terminal on the side of the non-inverting input of the first differential amplification circuit, and a second current mirror circuit having its input end connected to the output terminal on the side of the non-inverting input of the second differential amplification circuit.

Therefore, according to the present invention, the load for each differential amplification circuit is only the current mirror circuit, and the operation current value of the current mirror circuit in this case is uniformly determined by the output current value of the differential amplification circuit. The operational amplifier according to the present invention is therefore less susceptible to unevenness in devices, the changes of power supply voltages, and temperature change, thus providing a stable output characteristic. Furthermore, having only one stage of voltage amplification, the operational amplifier according to the present invention has an advantage over the one formed of a plurality of stages that it has an excellent high frequency characteristic with reduced phase delay.

In a preferred embodiment, the first differential amplification circuit includes first and second transistors of NPN type in a differential connection, and the second differential amplification circuit includes third and fourth transistors of PNP type in a differential connection.

In a further preferred embodiment, the differential amplification circuit includes a first constant current source for supplying a constant current to the emitters of the first and second transistors, and a second constant current source for supplying a constant current to the emitters of the third and fourth transistors.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
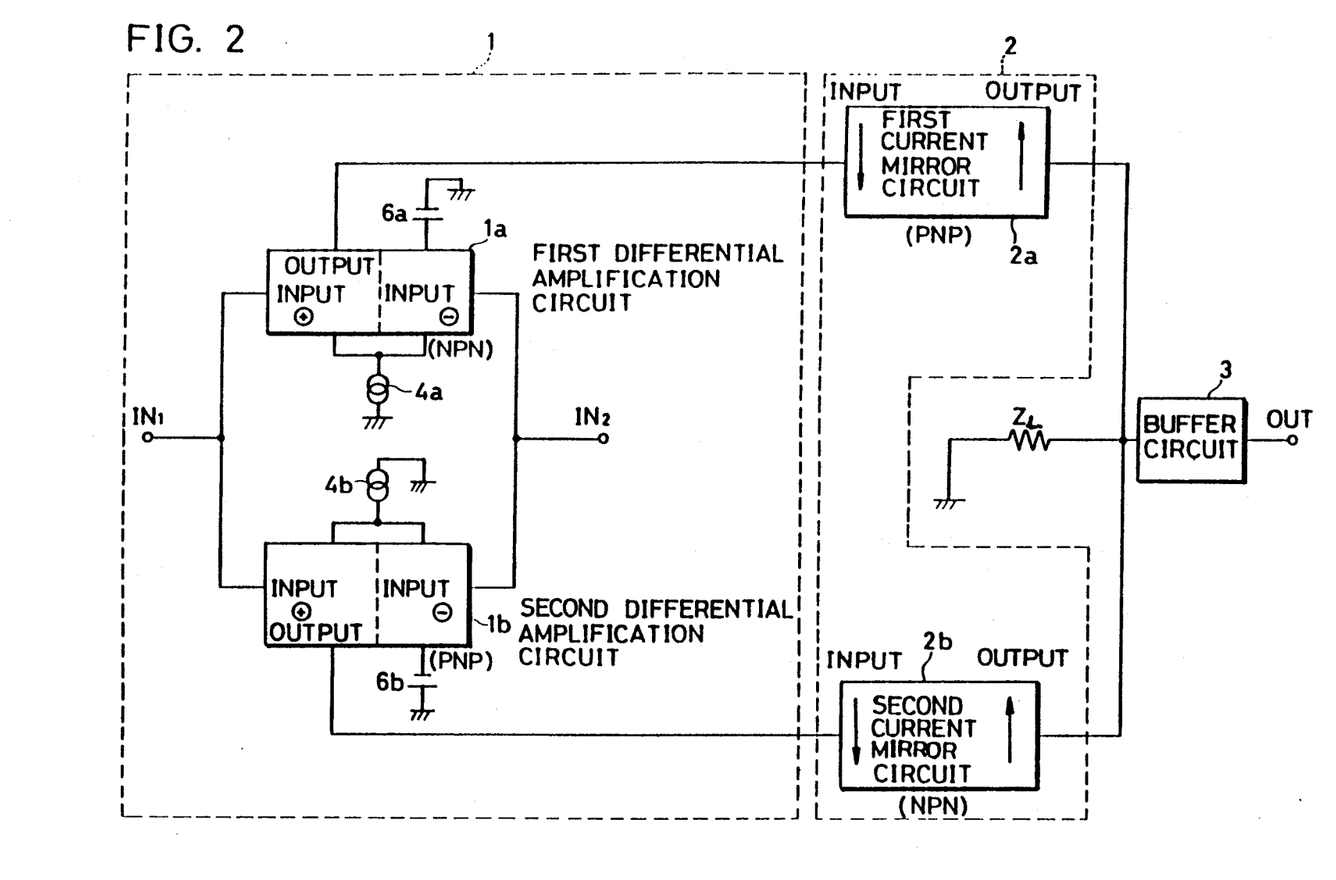
FIG. 2 is a block diagram schematically showing one embodiment of the present invention.
Figure 3:
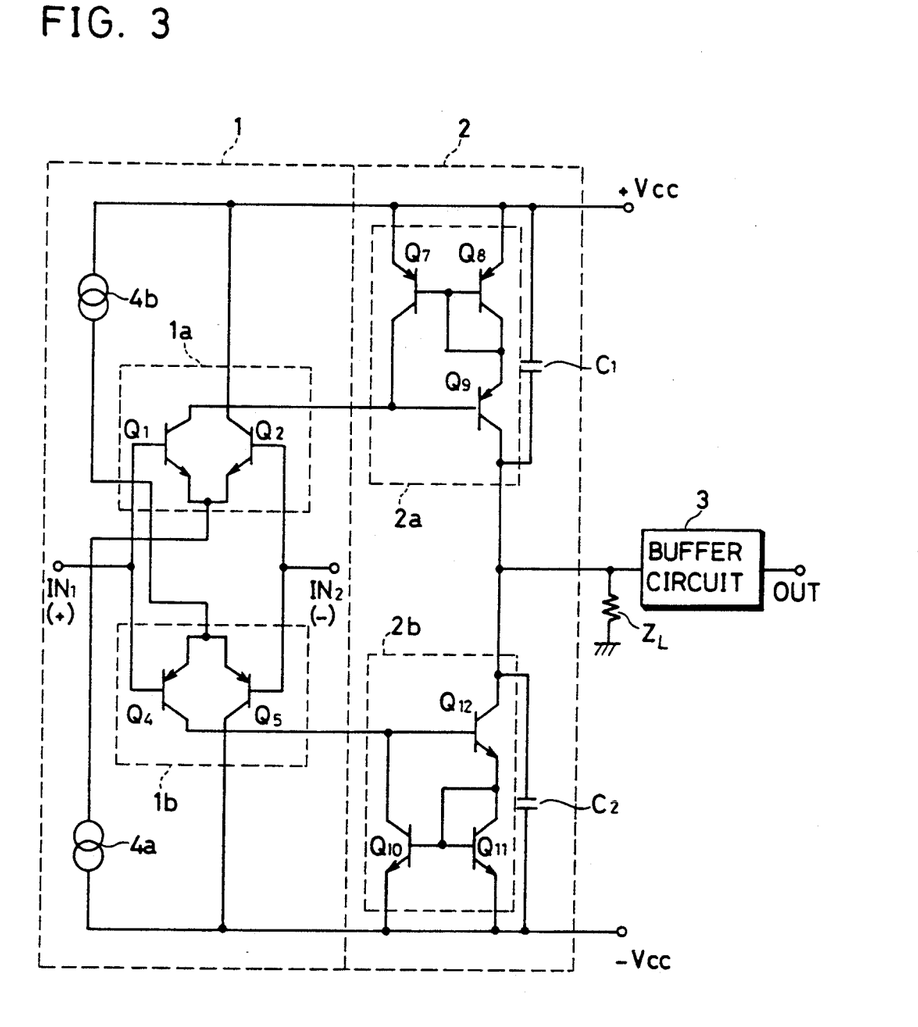
FIG. 3 is an electric circuit diagram specifically showing the operational amplifier shown in FIG. 2.

FIG. 2 is a block diagram schematically showing one embodiment of the present invention, and FIG. 3 is an electric circuit diagram specifically showing the operational amplifier shown in FIG. 2.

The operational amplifier shown in FIG. 2 includes a differential amplification stage 1 and a current mirror stage 2. The differential amplification stage 1 includes first and second differential amplification circuits 1a and 1b disposed symmetrically in the upper and lower parts in the circuit diagram, and the current mirror stage 2 includes first and second current mirror circuits 2a and 2b disposed symmetrically in the upper and lower parts in the circuit diagram.

More specifically stated, as shown in FIG. 3, first differential amplification circuit 1a, as similar to FIG. 1, includes differential-connected NPN transistors $Q_1$ and $Q_2$, second differential amplification circuit 1b includes differential-connected PNP transistors $Q_4$ and $Q_5$. The bases of transistors $Q_1$ and $Q_4$ are connected together to a non-inverting input terminal $IN_1$, and the bases of transistors $Q_2$ and $Q_5$ are connected together to an inverting input terminal $IN_2$. The collector of transistor $Q_1$ as an output end of the non-inverting input side of first differential amplification circuit 1a is connected to an input end of first current mirror circuit 2a, and the collector of transistor $Q_2$ as an output end on the side of the inverting input is supplied with a power supply voltage Vcc. The emitters of transistors $Q_1$ and $Q_2$ are connected to a constant current source 4a. The collector of transistor $Q_4$ as an output end on the side of the non-inverting input of second differential amplification circuit 1b is connected to an input end of second current mirror circuit 2b, the collector of transistor $Q_5$ has an output end on the inverting input side is supplied with a power supply voltage $-Vcc$, and the emitters of transistors $Q_4$ and $Q_5$ are connected to a constant current source 4b.

First current mirror circuit 2a includes three PNP transistors $Q_7$, $Q_8$ and $Q_9$, while second current mirror circuit 2b includes three NPN transistors $Q_{10}$, $Q_{11}$, and $Q_{12}$. A capacitor $C_1$ for phase compensation is connected to first current mirror circuit 2a, and a capacitor $C_2$ for phase compensation is connected to second current mirror circuit 2b. The emitters of transistors $Q_7$ and $Q_8$ are supplied with the power supply voltage Vcc, the collector of transistor $Q_7$ is connected to the base of transistor $Q_9$ as the input portion of first current mirror circuit 2a, and the bases of transistors $Q_7$ and $Q_8$ are connected to the emitter of transistor $Q_9$ and the collector of transistor $Q_8$. The collector of transistor $Q_9$ is connected to the input end of a buffer circuit 3 and one end of capacitor $C_1$, and the other end of capacitor $C_1$ is supplied with the power supply voltage Vcc.

The emitters of transistors $Q_{10}$ and $Q_{11}$ are supplied with the power supply voltage $-Vcc$, the collector of transistor $Q_{10}$ is connected to the base of transistor $Q_{12}$ as the input end of current mirror circuit 2b. The bases of transistors $Q_{10}$ and $Q_{11}$ are connected to the emitter of transistor $Q_{12}$ and the collector of transistor $Q_{11}$, the collector of transistor $Q_{12}$ is connected to the input end of buffer circuit 3 and to one end of capacitor $C_2$, and the other end of capacitor $C_2$ is supplied with the power supply voltage $-Vcc$.

The above-stated first and second constant current circuits 4a and 4b are formed of, for example, an FET of junction type, buffer circuits 3 is, for example, of a diamond shape, and an input impedance present therein functions as one load impedance $Z_L$ to first and second current mirror circuits 2a and 2b.

In addition to the input impedance existing in the buffer circuit 3, an independent impedance element may be provided externally to and in the preceding stage of buffer circuit 3. In this case, the load impedance $Z_L$ is formed by the parallel connection of the input impedance existing in buffer circuit 3 and the externally provided independent impedance element.

In the operational amplifiers shown in FIGS. 2 and 3, currents Ia and Ib flowing through first and second constant current circuits 4a and 4b are approximately identical (Ia=Ib), and thus the emitter currents of transistors $Q_1$, $Q_2$, $Q_4$, and $Q_5$ constituting first and second differential amplification circuits 1a and 1b are restricted. If the potential difference between signals applied to non-inverting input terminal $IN_1$ and inverting input terminal $IN_2$ is $\Delta V$, a collector current of $I_1+\Delta I_1$ (where $I_1$ is a current value when $\Delta V=0$) flows through first current mirror circuits 2a as the output of first differential amplification circuit 1a, and a collector current of $I_2-\Delta I_2$ (where $I_2$ is a current value when $\Delta V=0$) flows through second current mirror circuit 2b as the output of second differential amplification circuit 1b. A collector current approximately equal to the collector current of first differential amplification circuit $1a$ ($=I_3+\Delta I_3$) flows through the output transistor $Q_9$ of first current mirror circuit $2a$. Similarly, a collector current ($=I_4-\Delta I_4$) approximately equal to the collector current of first differential amplification circuit $1a$ flows through the output transistor $Q_{12}$ of second current mirror circuit $2b$. However, currents $I_3$ and $I_4$ are current values when $\Delta V = 0$. The collector currents of transistors $Q_9$ and $Q_{12}$ are input together to buffer circuit 3, and the difference current between them represented by $\Delta I_5 32$ $(I_3+\Delta I_3)-(I_4-\Delta I_4)=2\Delta I_3$ flows through load impedance $Z_L$. This is because the characteristics of transistors $Q_1$ and $Q_2$, and the characteristics of $Q_4$ and $Q_5$ are equal, current $I_a=I_b$ holds, and therefore $I_1=I_2$, $\Delta I_1=\Delta I_2$, $I_3=I_4$, $\Delta I_3=\Delta I_4$ can also be established. A voltage of $\Delta V_5=\Delta I_5 \times Z_0$ is generated on the both ends of load impedance $Z_L$ as a result. This voltage being current-amplified at buffer circuit 3 is output from output terminal OUT.

As in the foregoing, according to one embodiment of the present invention, as opposed to a conventional operational amplifier in which constant current circuits and transistors of base-grounded type are connected together to the outputs of differential amplification circuits, only current mirror circuits $2a$ and $2b$ are independently connected to the output ends of differential amplification circuit $1a$ and $1b$, respectively, and, therefore, the operation currents of current mirror circuits $2a$ and $2b$ are uniformly determined by the collector currents of transistors $Q_1$, $Q_2$, $Q_4$, and $Q_5$ constituting differential amplification circuits $1a$ and $1b$. Consequently, the differential amplifier is less susceptible to the adverse effects of changes of supply voltages, temperature change, etc. and provides a stable output characteristic.

Although in the embodiment shown in FIG. 3, second differential amplification circuit $1b$ must be formed of PNP type transistors $Q_4$ and $Q_5$ if first differential amplification circuit $1a$ is formed of NPN type transistors $Q_1$ and $Q_2$, second differential amplification circuit $1b$ may be formed of NPN type transistors if first differential amplification circuit $1a$ is formed of PNP type transistors.

Figure 4:
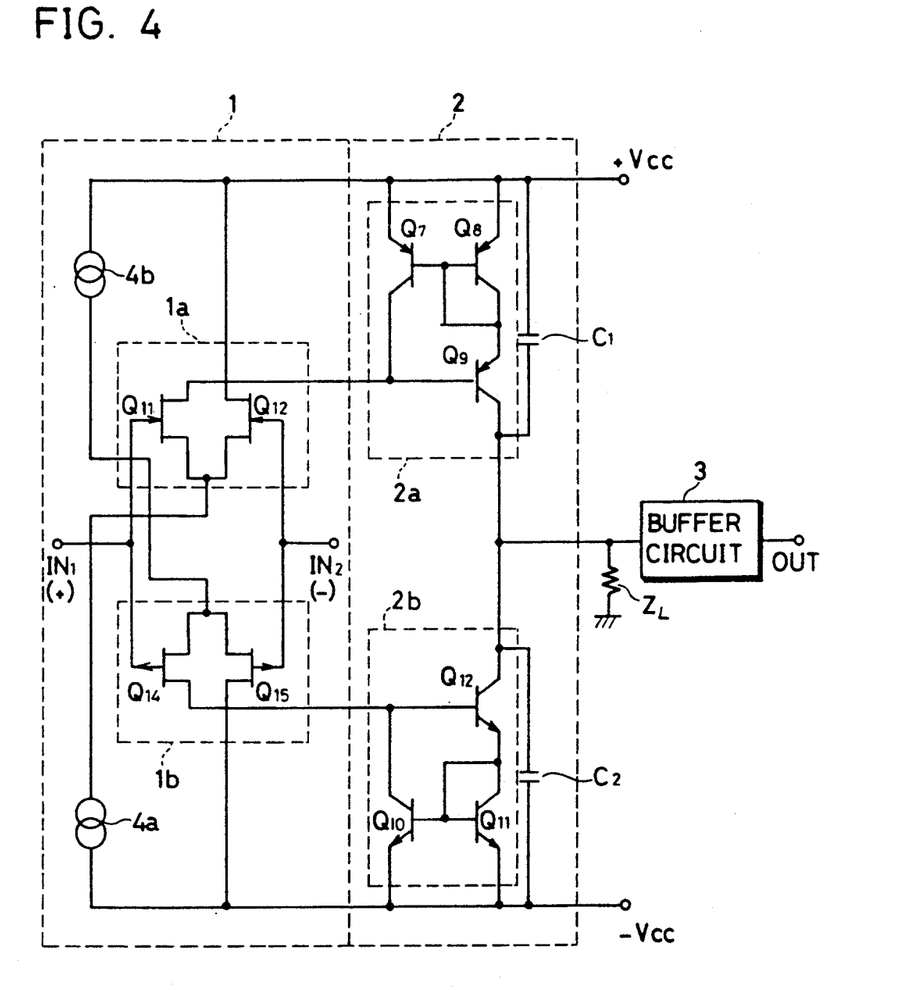
FIG. 4 is an electric circuit diagram showing another embodiment of the present invention.

FIG. 4 is an electric circuit diagram showing another embodiment of the present invention. The embodiment shown in FIG. 4 is substantially identical to the structure shown in FIG. 3 with essential differences being that N channel FETs $Q_{11}$ and $Q_{12}$ are utilized in place of the NPN type transistors $Q_1$ and $Q_2$ of first differential amplification circuit $1a$, and P channel FETs $Q_{14}$ and $Q_{15}$ are utilized in place of the PNP type transistors $Q_4$ and $Q_5$ of second differential amplification circuit $1b$. The gate, drain, and source of an FET corresponds to the base, collector, and emitter of a transistor, respectively.

In the embodiment shown in FIG. 3 or FIG. 4, if first differential amplification circuit $1a$ is formed of NPN transistors or N channel FETs, the transistors of first current mirror circuit $2a$ must be of PNP type, and conversely, if first differential amplification circuit $1a$ is formed of PNP transistors or P channel FETs, first current mirror circuit $2a$ must be formed of NPN type transistors. The same is applied to second differential amplification circuit $1b$ and second current mirror circuit $2b$.

Figure 5:
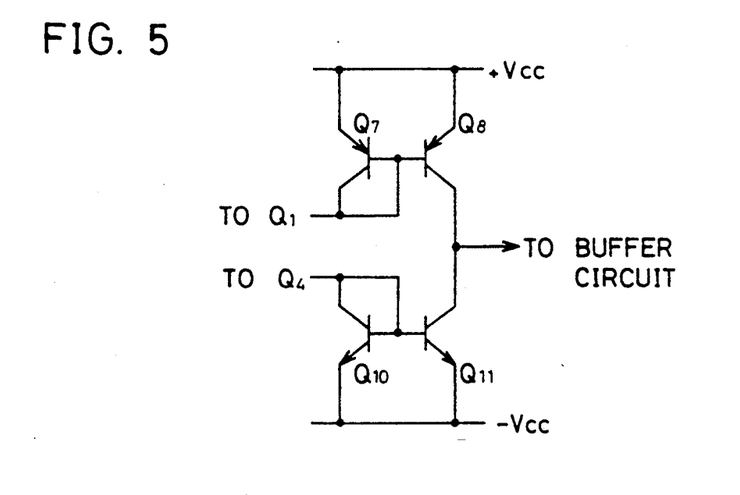
FIG. 5 is an electric circuit diagram showing another example of a current mirror circuit.

FIG. 5 is an electric circuit diagram showing another example of a current mirror circuit. The current mirror circuit shown in FIG. 5 is formed of two sets of transistors $Q_7$ and $Q_8$, and $Q_{10}$ and $Q_{11}$ instead of transistors $Q_7$, $Q_8$, $Q_9$, $Q_{10}$, $Q_{11}$ and $Q_{12}$ of the current mirror circuits $2a$ and $2b$ shown in FIGS. 3 and 4. The bases of transistors $Q_7$ and $Q_8$ are connected to the collector of transistor $Q_7$ and the collector of transistor $Q_1$ shown in FIG. 3 or the drain of FET $Q_{11}$ shown in FIG. 4. The bases of transistors $Q_{10}$ and $Q_{11}$ are connected to the collector of transistor $Q_{10}$ and the collector of transistor $Q_4$ shown in FIG. 3 or the drain of FET $Q_{14}$ shown in FIG. 14.

Figure 6:
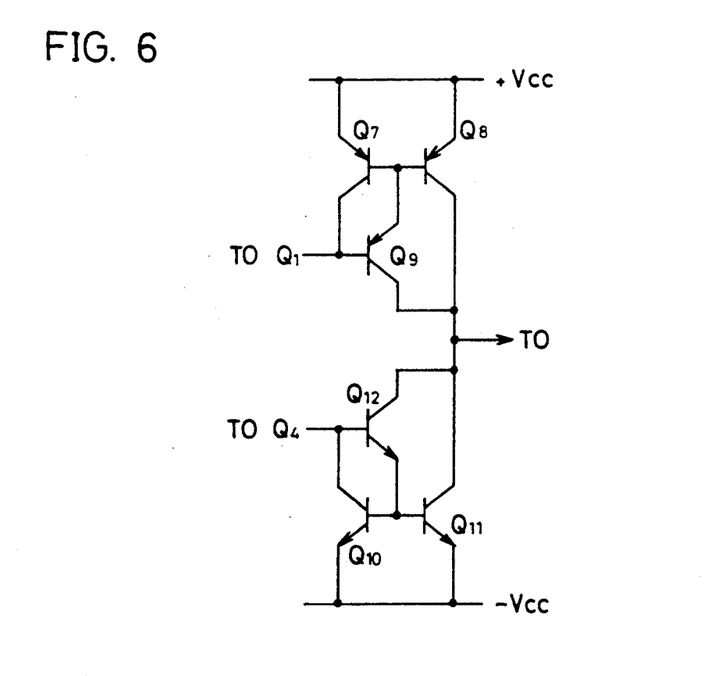
FIG. 6 is an electric circuit diagram showing yet another example of a current mirror circuit.

FIG. 6 is an electric circuit diagram showing yet another example of a current mirror circuit. In the current mirror circuit shown in FIG. 6, the collector of transistor $Q_8$ is connected to the collector of transistor $Q_9$ and to the input end of buffer circuit 3 shown in FIG. 3, while the emitter of transistor $Q_9$ is connected to the bases of transistors $Q_7$ and $Q_8$, and the collector of transistor $Q_7$ and the base of transistor $Q_9$ are connected to the collector of transistor $Q_1$ shown in FIG. 3 or the drain of FET $Q_{11}$ shown in FIG. 4.

The other current mirror circuit includes transistors $Q_{10}$, $Q_{11}$, and $Q_{12}$ connected in a similar manner.

As in the foregoing, the operational amplifier according to the present invention has one stage of voltage amplification, and achieves an excellent high frequency characteristic with reduced phase delay, as compared to the one formed of a plurality of stages.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An operational amplifier including a non-inverting input terminal and an inverting input terminal, comprising:

differential amplification means including a first differential amplification circuit having a non-inverting input end connected to said non-inverting input terminal and an inverting input end connected to said inverting input terminal, and a second differential amplification circuit having a non-inverting input end connected to said non-inverting input terminal and an inverting input end connected to said inverting input terminal;

current mirror means including;

a first current mirror circuit, an output end of the first differential amplification circuit associated with the non-inverting inverting input end of said first differential amplification circuit being connected to an input end of the first current mirror circuit; and a second current mirror circuit, an output end of the second differential amplification circuit associated with the non-inverting input end of said second differential amplification circuit being connected to an input end of the second current mirror circuit; and a load impedance element connected together to output ends of said first and second current mirror circuits;

the differential amplification means and current mirror means being adapted to connect to a first power supply for supplying a first reference potential to an output end associated with the inverting input end of said first differential amplification circuit, and a second power supply for supplying a second reference potential to an output end associated with the inverting input end of said second differential amplification circuit;

said first differential amplification circuit including:
- a first transistor of NPN type having its base connected to said non-inverting input terminal, and its collector connected to the input end of said first current mirror circuit, and
- a second transistor of NPN type having its base connected to said inverting input terminal and its collector adapted to be connected to said first power supply; and said second differential amplification circuit including:
- a third transistor of PNP type having its base connected to said non-inverting input terminal and its collector connected to the input end of said second current mirror circuit, and
- a fourth transistor of PNP type having its base connected to said inverting input terminal and its collector adapted to be connected to said second power supply; and further comprising a first phase compensation capacitance coupled to the output end of the first current mirror circuit and adapted to be connected to the first power supply; and a second phase compensation capacitance coupled to the output end of the second current mirror circuit and adapted to be connected to the second power supply.

2. An operational amplifier as recited in claim 1, wherein:
the emitters of said first and second transistors are connected together;
the emitters of said third and fourth transistors are connected together: and
said differential amplification means includes:
- a first constant current source for supplying a constant current to the emitters of said first and second transistors, and
- a second constant current source for supplying a constant current to the emitters of said third and fourth transistors.

3. An operational amplifier as recited in claim 2, wherein said first current mirror circuit includes:
- a fifth transistor of PNP type having its collector connected to the collector of said first transistor and its emitter adapted to be connected to said first power supply,
- a sixth transistor of PNP type having its base and collector connected to the base of said fifth transistor and its emitter adapted to be connected to said first power supply, and
- a seventh transistor of PNP type having its base connected to the collector of said first transistor, its collector connected to said load impedance element and its emitter connected to the bases of said fifth and sixth transistors; and said second current mirror circuit includes:
- an eighth transistor of NPN type having its collector connected to the collector of said third transistor and its emitter adapted to be connected to said second power supply,
- a ninth transistor of NPN type having its base and collector connected to the base of said eighth transistor and its emitter adapted to be connected to said second power supply, and
- a tenth transistor of NPN type having its base connected to the collector of said third transistor, its collector connected to said load impedance element, and its emitter connected to the bases of said eighth and ninth transistors.

4. An operational amplifier as recited in claim 2, wherein said first current mirror circuit includes:
- a fifth transistor of PNP type having its collector and base connected to the collector of said first transistor and its emitter adapted to be connected to said first power supply, and
- a sixth transistor of PNP type having its base connected to the base of said fifth transistor, its emitter adapted to be connected to said first power supply and its collector connector to said load impedance element said second current mirror circuit including
- a seventh transistor of NPN type having its collector and base connected to the collector of said third transistor, and its emitter adapted to be connected to said second power supply, and
- an eighth transistor of NPN type having its base connected to the base of said seventh transistor, its emitter adapted to be connected to said second power supply, and its collector connected to said load impedance element.

5. An operational amplifier as recited in claim 2 wherein:
said first current mirror circuit includes:
- a fifth transistor of PNP type having its collector connected to the collector of said first transistor and its emitter adapted to be connected to said first power supply,
- a sixth transistor of PNP type having its base connected to the base of said fifth transistor and its emitter adapted to be connected to said first power supply, and
- a seventh transistor of PNP type having its base connected to the collector of said first transistor, its collector connected to the collector of said sixth transistor, and its emitter connected to the bases of said fifth and sixth transistors, the collectors of said sixth and seventh transistors being connected to said load impedance element, said second current mirror circuit including:
- an eighth transistor of NPN type having its collector connected to the collector of said third transistor and its emitter adapted to be connected to said second power supply,
- a ninth transistor of NPN type having its base connected to the base of said eighth transistor and its emitter adapted to be connected to said second power supply, and
- a tenth transistor of NPN type having its base connected to the collector of said third transistor, its emitter connected to the bases of said eighth and ninth transistors, the collectors of said ninth and tenth transistors being connected to said load impedance element.

6. An operational amplifier as recited in claim 1, wherein said first current mirror circuit includes:
- a fifth transistor of PNP type having its collector connected to the collector of said first transistor, and its emitter connected to said first power supply,
- a sixth transistor of PNP type having its base and collector connected to the base of said fifth transistor, and its emitter connected to said first power supply, and
- a seventh transistor of PNP type having its base connected to the collector of said first transistor, its collector connected to said load impedance element, and its emitter connected to the bases of said fifth and sixth transistors; and said second current mirror circuit includes:
- an eighth transistor of NPN type having its collector connected to the collector of said third transistor, and its emitter connected to said second power supply,
- a ninth transistor of NPN type having its base and collector connected to the base of said eighth transistor, and its emitter connected to said second power supply, and
- a tenth transistor of NPN type having its base connected to the collector of said third transistor, its collector connected to said load impedance element, and its emitter connected to the bases of said eighth and ninth transistors.

7. An operational amplifier as recited in claim 1, wherein said first current mirror circuit includes:
- a fifth transistor of PNP type having its collector and base connected to the collector of said first transistor, and its emitter connected to said first power supply, and
- a sixth transistor of PNP type having its base connected to the base of said fifth transistor, its emitter connected to said first power supply, and its collector connected to said load impedance element; and said second current mirror circuit includes:
- a seventh transistor of NPN type having its collector and base connected to the collector of said third transistor, and its emitter connected to said second power supply, and
- an eighth transistor of NPN type having its base connected to the base of said seventh transistor, its emitter connected to said second power supply, and its collector connected to said load impedance element.

8. An operational amplifier as recited in claim 1, wherein said first current mirror circuit includes:
- a fifth transistor of PNP type having its collector connected to the collector of said first transistor and its emitter connected to said first power supply,
- a sixth transistor of PNP type having its base connected to the base of said fifth transistor, its emitter connected to said first power supply, and its collector connected to said load impedance element, and
- a seventh transistor of PNP type having its base connected to the collector of said fifth transistor, its emitter connected to the bases of said fifth and sixth transistors, and its collector connected to said load impedance element; and said second current mirror circuit includes:
- an eighth transistor of NPN type having its collector connected to the collector of said third transistor and its emitter connected to said second power supply,
- a ninth transistor of NPN type having its base connected to the base of said eighth transistor, its emitter connected to said second power supply, and its collector connected to said load impedance element, and
- a tenth transistor of NPN type having its base connected to the collector of said eighth transistor, its emitter connected to the bases of said eighth and ninth transistors, and its collector connected to said load impedance element.

9. An operational amplifier as recited in claim 1, wherein said output ends associated with the non-inverting inputs of said first and second differential amplification circuits are respectively the collectors of said first and third transistors.

10. An operational amplifier as recited in claim 1, wherein said output ends associated with the inverting inputs of said first and second differential amplification circuits are respectively the collectors of said second and fourth transistors.

* * * * *